(12) United States Patent
Iida et al.

(10) Patent No.: US 6,403,988 B2
(45) Date of Patent: Jun. 11, 2002

(54) SEMICONDUCTOR DEVICE WITH REVERSE CONDUCTING FACULTY

(75) Inventors: Katsuji Iida; Takeshi Sakuma; Yuichiro Imanishi, all of Nagoya; Naohiro Shimizu, Miura, all of (JP)

(73) Assignee: NGK Insulators, Ltd., Nagoya (JP)

( * ) Notice: Subject to any disclaimer, the term of this patent is extended or adjusted under 35 U.S.C. 154(b) by 0 days.

(21) Appl. No.: 09/776,577

(22) Filed: Feb. 2, 2001

(30) Foreign Application Priority Data

Feb. 8, 2000 (JP) ........................................ 2000-030502

(51) Int. Cl.⁷ ........................ H01L 29/74; H01L 31/111
(52) U.S. Cl. ........................................ 257/139; 257/144
(58) Field of Search ........................ 257/139, 144, 257/330, 331, 332

(56) References Cited

U.S. PATENT DOCUMENTS

| | | | | |
|---|---|---|---|---|
| 4,644,240 A | * | 2/1987 | Horie et al. | |
| 4,937,639 A | * | 6/1990 | Yao et al. | |
| 4,945,266 A | * | 7/1990 | Mori | |
| 5,668,384 A | * | 9/1997 | Murakami | |
| 5,679,966 A | * | 10/1997 | Baliga et al. | |

\* cited by examiner

*Primary Examiner*—Stephen D. Meier
(74) *Attorney, Agent, or Firm*—Burr & Brown

(57) ABSTRACT

A semiconductor device constructed as a reverse conducting static induction thyristor including a thyristor section 114 formed by an n⁻ silicon substrate 101, p⁺ gate regions 102, 104 formed in one surface of the substrate, a p⁺ anode region 111 formed in the other surface of the substrate, a main diode section 134 having a cathode region formed by the silicon substrate and an anode region 131 formed in the one surface of the substrate, and a series arrangement 145 of diodes including plural p⁺ anode regions 142, plural n⁺ cathode contact regions 143 formed in the first surface of the substrate, and plural conductive layers 144 connecting these anode regions and cathode contact legions successively. An anode and a cathode of the series arrangement of diodes are connected to a cathode electrode 110 and an anode electrode 113 of the thyristor section. Each of diodes in the series arrangement has a breakdown voltage lower than that of the thyristor section.

21 Claims, 19 Drawing Sheets

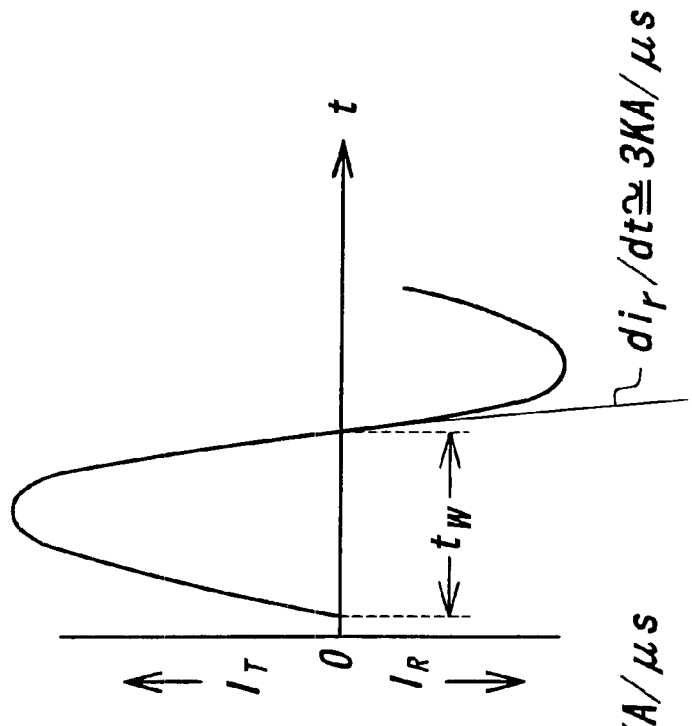
FIG. 6A *PRIOR ART*
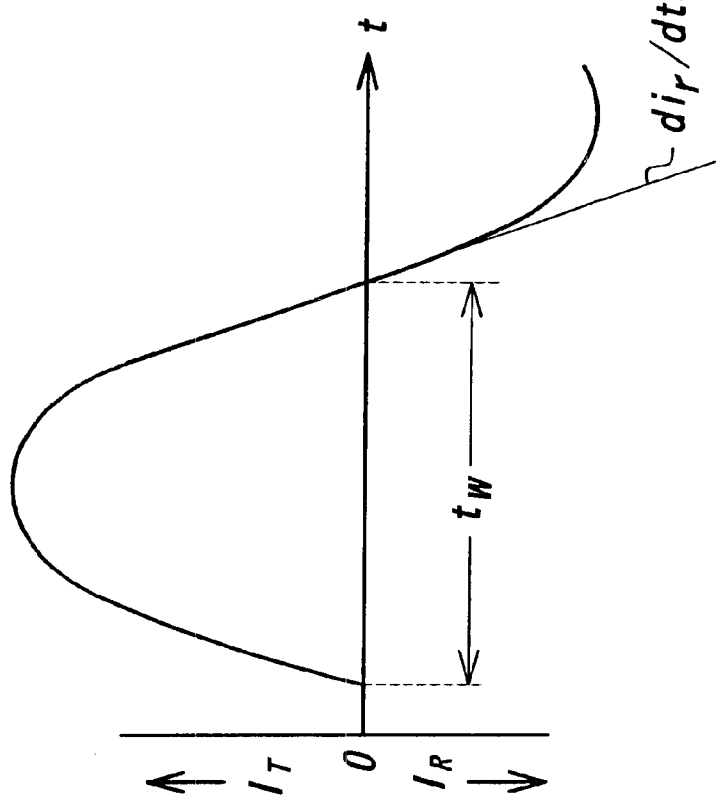
FIG. 6B *PRIOR ART*

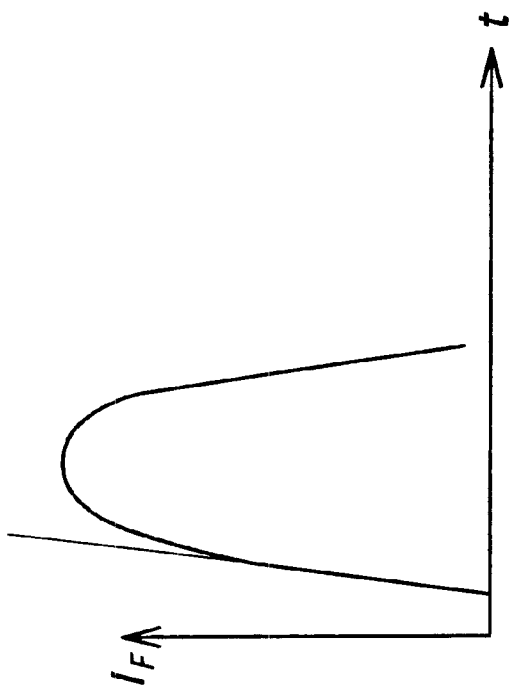
FIG. 9B _PRIOR ART_
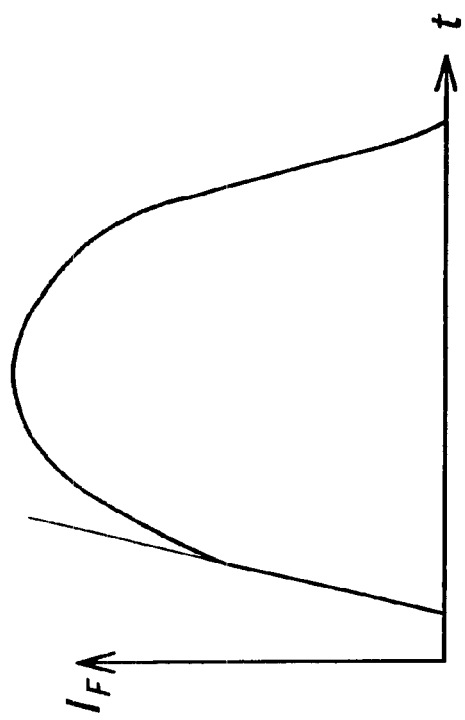
FIG. 9A _PRIOR ART_

SEMICONDUCTOR DEVICE WITH REVERSE CONDUCTING FACULTY

BACKGROUND OF THE INVENTION

1. Field of the Invention

The present invention relates to a semiconductor device, and more particularly to a semiconductor device having reverse conducting faculty comprising a switching element including a semiconductor substrate of a first conductivity type having first and second major surfaces, a first main electrode region of the first conductivity type formed on the first major surface of the semiconductor substrate, a second major electrode region of a second conductivity type formed on the second surface of the semiconductor substrate, and a control electrode region of the second conductivity type for controlling a current passing between the first and second main electrode regions.

2. Description of the Related Art

As a voltage supply source for a pulse laser and pulse discharge device, there has been used a voltage supply source generating a pulse having a high voltage and a large current. FIG. I shows an example of a known pulse generating circuit used as a voltage supply source for use in a pulse laser. In this pulse generating circuit, between output terminals 14a and 14b of a charging circuit 14 including a DC power sur)ply source 11, a switch 12 and a current limiting resistor 13, is connected a static induction thyristor 15 (herein after abbreviated as SIThy). In parallel with the SIThy 15, there are connected resonance coil 16 and capacitor 17. Furthermore, in parallel with the capacitor 17 are connected a capacitor 18 and a coil 19 having a large inductance, and a discharge gap 20 is connected across the coil 19 as a load.

Under a non-conductive condition of the SIThy 15, at first the switch 12 is closed to charge the capacitor 17 through the resistor 13 and coil 16. During this charging process, an impedance of the coil 19 at a lower frequency is low, and thus the capacitor 18 is also charged through the coil 19. Now an output voltage of the DC power supply source 11 is denoted by E. After charging the capacitors 17 and 18 up to E, the SIThy 15 is turned-on by means of a gate driving circuit 21. Then, charge stored in the capacitor 17 is discharged through the SIThy 15 in accordance with a resonance characteristic determined by the coil 16 and capacitor 17, and the capacitor 17 is charged in a reverse polarity to a polarity in which the capacitor 17 is charged up to substantially −E. Charge stored in the capacitor 18 is also discharged through the SIThy 15 and coil 19. Since an impedance of the coil 19 is very high for a high frequency, the discharge is conducted very slowly. Therefore, a voltage of about −2E will be applied across the discharge gap 20. When a discharge occurs, charge stored in the capacitors 17 and 18 disappears by discharge at the discharge gap 20. And the switch 12 is closed to initiate the charging operation again.

In the above mentioned pulse generating circuit, if the discharging operation is carried out correctly between the discharge gap 20 when a voltage of −2E is applied across the discharge gap, charge stored in a resonance circuit consisting of the coil 16 and capacitor 17 disappears. Therefor, as shown by a solid line in FIG. 2, no current flows through the SIThy 15 in the reverse direction. However, if discharge does not occur correctly due to any reason, a ringing current occurs in the resonance circuit and a large current flows through the SIThy 15 in the reverse direction as illustrated by a broken line in FIG. 2.

FIG. 3 is a graph showing a voltage across the anode-cathode path of the SIThy 15. When discharge does not occurs correctly, a reverse voltage is applied to the SIThy 15. In this case, a reverse current flows from the cathode to the gate of the SIThy 15, and this results in application of an excessive high reverse voltage like as a reverse recovery phenomenon of the diode.

In order to protect the static induction thyristor from the breakdown when the large reverse current flows through the anode-cathode path of the thyristor, it has been proposed to flow the reverse current through a diode connected in anti-parallel with the static induction thyristor. The static induction thyristor having such a diode is generally called a reverse conducting static induction thyristor. In the reverse conducting static induction thyristor, in order to make a wiring inductance as small as possible, it has been proposed to form the diode by a common semiconductor substrate together with the static induction thyristor in a preliminary thesis issued for 1999 Conference of the Electric Engineering Society by Shimizu et al., "4000V Class Reverse Conducting SI Thyristor(1)".

FIG. 4 is an equivalent circuit of the above mentioned reverse conducting static induction thyristor. A diode 32 is connected in anti-parallel with a static induction thyristor (SIThy) 31 such that an anode of the diode is connected to a cathode of the SIThy and a cathode of the diode is connected to an anode of the SIThy. The anode of the diode 32 is further connected to a gate of the SIThy 31 by means of a resistor 33, and the gate of the SIThy is connected to a gate driving circuit (GC) 34 which controls the turn-on/turn-off of the SIThy. When a main power supply source 35 is connected across the anode-cathode path of the SIThy 31 as shown by a solid line in FIG. 4, a current $I_T$ flows through the SIThy, and when a voltage supply source 36 is connected in a reverse polarity as depicted by a broken line in FIG. 4, a current $I_R$ flows through the diode 32 to protect the SIThy 31 from being breakdown.

FIG. 5 is a cross sectional view showing the structure of the above mentioned known reverse conducting static induction thyristor. In one major surface of an n⁻ silicon substrate 41 there is formed a p⁺ gate regions 42, and p⁺ buried gate regions 43 are formed within a channel region. A gate electrode 45 is provided on the gate region 42 via a conductive layer 45a. The buried gate regions 43 are formed as a comb shape to be surrounded by the gate region 42. Above the channel region, there are formed n⁺ cathode regions 46 which are electrically connected to a cathode electrode 47 via a conductive layer 47a. On the other major surface of the silicon substrate 41, an anode electrode 52 is provided via a conductive layer 52a. In this manner, a thyristor section 44 is constructed by the gate region 42, buried gate regions 43, channel region, cathode regions 46. Furthermore, a diode section 49 is formed to surround the thyristor section 44 via a separation band 48. The diode second includes a p⁺ anode region 50 and a cathode region 41a formed by a part of the n⁻ silicon substrate 41. The anode region 50 is electrically connected to the cathode electrode 47 of the static induction thyristor via a conductive layer 47a and the cathode region 41a is connected to an anode electrode 52 of the static induction thyristor by means of n⁺ contact region 51 and conductive layer 52a.

In the above explained reverse conducting static induction thyristor, when a reverse voltage is applied across the anode-cathode main current path, the diode section 49 is made conductive to prevent the thyristor section 44 from the breakdown. However, when the known reverse conducting thyristor is used in the above mentioned pulse generating circuit shown in FIG. 1, the static induction thyristor is often broken by the ringing current generated in the resonance circuit by failure of discharge. In order to investigate a mechanism of such a phenomenon, the inventors have conducted a detailed analysis about the influence of the application of the reverse voltage across the anode-cathode path of the reverse conducting static induction thyristor.

FIGS. 6, 7 and 8 are graphs showing the operation of the static induction thyristor used in the pulse generating circuit upon occurrence of discharge failure. FIG. 6 represent a variation of a current $I_{ak}$ flowing through the anode-cathode path, FIG. 7 shows a variation of a gate current $I_g$ and FIG. 8 denotes a variation of a gate voltage $V_g$. In these figures, A represents a case in which a pulse duration $t_w$ is long, and B shows a case in which a pulse duration $t_w$ is long. When the current $I_{ak}$ is larger than 3000 A and the pulse duration $t_w$ is longer than several tens µs, breakdown of the reverse conducting static induction thyristor does not occur. However, when a pulse duration $t_w$ is set to a shorter value within a range from several hundreds ns to several µs, the reverse conducting static induction thyristor might be broken. In this case, a breakdown point situates in the static induction thyristor section and no abnormal phenomenon occurs in the diode section. From these phenomena, it is assumed that the breakdown of the reverse conducting static induction thyristor depends on an inclination of a raising portion of the current $I_{ak}$. In the longer pulse duration shown in FIG. 6A, an inclination of a reverse current $i_r$ ($di_r/dt$) is about 0.5 KA/µs, and in the shorter pulse duration illustrated in FIG. 6B, an inclination of the reverse current is about 3 KA/µs. Furthermore, as depicted in FIG. 8B, when the breakdown of the reverse conducting static induction thyristor due to discharge failure occurs, a remarkable variation appears in the gate voltage $V_g$ immediately after a reverse voltage peak.

Next the performance of the diode upon an occurrence of an abruptly increase in the current flowing through the diode is analyzed. FIGS. 9 and 10 show a forward current IF flowing through the anode-cathode path of the diode 32 shown in FIG. 4 and a forward voltage drop $V_F$ appearing across the anode-cathode path of the diode when the diode is operated by a pulse. A denotes a case of a smaller inclination and B represents a case of s larger inclination. From these graphs it can be understood that there is an intimate correlation between the inclination of the raising portion of the current $I_F$ and a transient on-voltage (forward recovery voltage) $V_{FP}$ as shown in FIG. 11. That is to say, for the diode having the breakdown voltage of 4000 V, when the inclination of the current $I_F$ ($dI_F/dt$) is about 500 A/µs, the forward recovery voltage $V_{FP}$ is lower such as about 70 V, but when the inclination of the current ($dI_F/dt$) is high such as 1000 A/µs and 2000 A/µs, the forward recovery voltage $V_{FP}$ is becomes higher such as about 100 V and 170 V, respectively.

FIG. 12 is a graph showing a relationship between the forward recovery voltage $V_{FP}$ and the breakdown voltage of the diode for the inclination $dI_F/dt$ of 2000 A/µs. In accordance with the increase in the diode breakdown voltage, the forward recovery voltage $V_{FP}$ becomes higher. When the diode has a breakdown voltage of 4000 V, the forward recovery voltage $V_{FP}$ is about 170 V. In the reverse conducting static induction thyristor, the breakdown voltage of the diode section should be not lower than the breakdown voltage of the thyristor section, and therefore the diode section should have the breakdown voltage of several thousands volts. The diode section having such a high breakdown voltage also has a high forward recovery voltage $V_{FP}$.

In other words, the higher the breakdown voltage of the diode section is, the forward pulse current hardly flows through the diode section.

In the manner explained above, in the known reverse conducting static induction thyristor having a breakdown voltage of, for instance 4 KV, when a large reverse current is to flow immediately after conducting a large forward current, the protection diode section could not be made conductive, and a large amount of carriers stored in the channel regions in FIG. 5 flow abruptly in the reverse direction from the cathode region 46 to the buried gate region 43. Particularly, in a region denoted by X in FIG. 5, i.e. in a vicinity of the buried gate region 43 into which the gate current is supplied much more abruptly than the central gate region 42, an excessive amount of carriers are generated and there is produced a filamentation between the channel regions by the diode reverse recovery phenomenon of the diode section and the thyristor section 44 might be destroyed.

It should be noted that the above explained problem occurs not only in the reverse conducting static induction thyristor, but also in a semiconductor switching device such as normal type thyristor, gate turn-off (GTO) SCR and insulated gate bipolar transistor (IGBT).

SUMMARY OF THE INVENTION

The present invention has for its object to provide a novel and useful semiconductor device, in which the above mentioned problem of the known reverse conducting static induction thyristor, and even if a high reverse voltage is applied to a switching element abruptly, a protection diode can be brought into conductive and the switching element can be effectively protected from the breakdown.

According to the invention, a semiconductor device having reverse conducting faculty comprises:

a switching element including a semiconductor substrate of a first conductivity type having first and second major surfaces, a first main electrode region of the first conductivity type formed in the first major surface of the semiconductor substrate, a first main electrode connected to said first main electrode region, a second main electrode region of a second conductivity type formed in the second major surface of the semiconductor substrate, a second main electrode connected to said second main electrode region, a control electrode region of the second conductivity type formed in the first major surface of the semiconductor substrate for controlling a current passing between the first and second main electrode regions, and a control electrode connected to said control region; and a series arrangement of a plurality of diodes connected between said first main electrode and said second main electrode in an opposite polarity to a current flowing between said first main electrode region and said second main electrode region, each of said plurality of diodes having a breakdown voltage lower than a breakdown voltage of said switching element.

Upon practicing the semiconductor device according to the present invention, it is preferable that said series arrangement of a plurality of diodes is formed in said first major surface of the semiconductor substrate in which said first main electrode region is also formed. Such a structure is particularly suitable for a high frequency pulse circuit in which inductance of wiring has to be reduced as far as possible. According to the invention, said series arrangement of a plurality of diodes may be formed on a separate semiconductor substrate from said semiconductor substrate semiconductor substrate which constitutes said switching element, or said series arrangement of a plurality of diodes may be formed as a diode stack including first and second electrodes connected to said first and second main electrodes of the switching element, respectively.

In the latter two cases, it is preferable that said switching device and series arrangement of a plurality of diodes are installed in a common package in view of a reduction of wiring inductance. However, according to the invention, said switching device and series arrangement of a plurality of diodes may be in separate packages.

In a preferable embodiment of the semiconductor device according to the present invention, said switching element is formed as a static induction thyristor whose cathode region and cathode electrode are formed by said first main electrode region and first main electrode, respectively, whose anode region and anode electrode are formed by said second main electrode region and second main electrode, respectively, and whose gate region and gate electrode are formed by said control region and control electrode, respectively.

In another preferable embodiment of the switching device according to the invention, said switching element is formed as a reverse conducting static induction thyristor including thyristor section whose cathode region and cathode electrode are formed by said first main electrode region and first main electrode, respectively, whose anode region and anode electrode are formed by said second main electrode region and second main electrode, respectively, and whose gate region and gate electrode are formed by said control region and control electrode, respectively; and a main diode section having an anode region connected to said cathode electrode of the thyristor section and a cathode region connected to said anode electrode of the thyristor section.

In these preferable embodiments, said series arrangement of a plurality of diodes are preferably formed as field limiting rings surrounding said static induction thyristor. In this case, a plurality of diodes of said series arrangement may be preferably formed such that breakdown voltages of the diodes are gradually increased toward outside.

BRIEF DESCRIPTION OF THE DRAWINGS

FIGS. 6A, 6B; 7A, 7B and 8A, 8B are signal waveforms explaining the operation of the known reverse conducting static induction thyristor;

FIGS. 9A and 9B are signal waveforms representing a forward recovery characteristic of the known reverse conducting static induction thyristor:

DESCRIPTION OF THE PREFERRED EMBODIMENTS

Now the present invention will be explained in detail with reference to several embodiments shown in the accompanying drawings.

Figure 13:
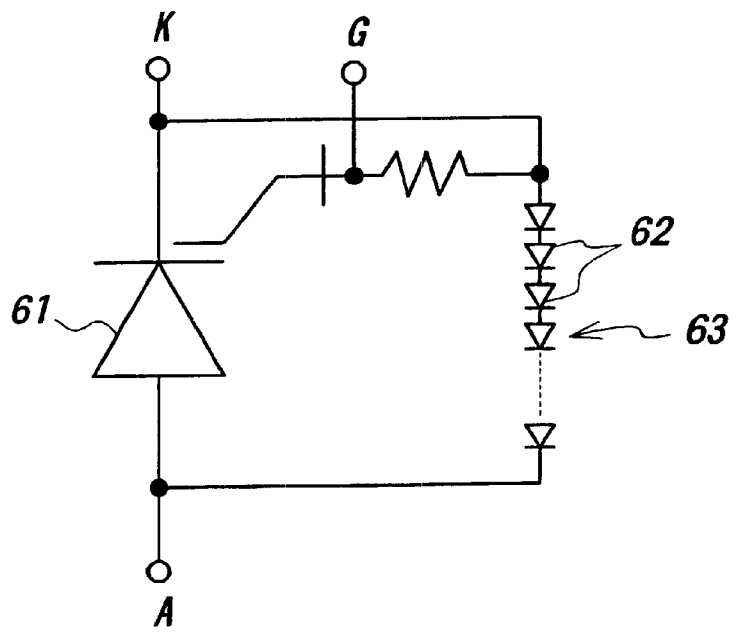
FIG. 13 is a schematic diagram illustrating a principal structure of the semiconductor device according to the invention.

FIG. 13 is a schematic diagram slowing a principal structure of the semiconductor device according to the invention. As explained above, according to the invention, the switching element may be formed not only by a static induction thyristor, but also by another semiconductor switching element such as SCR and IGBT. For the sake of explanation, hereinafter the switching element is formed by a static induction thyristor.

According to the invention, between an anode A and a cathode K of a static induction thyristor 61, is connected a series arrangement 63 of a plurality of diodes 62 is connected such that an anode of the series arrangement of diodes 63 is connected to the cathode K of the static induction thyristor 61 and a cathode of the series arrangement of diodes is connected to the anode A of the static induction thyristor, each of said plurality of diodes 62 having a breakdown voltage which is lower than a breakdown voltage of the static induction thyristor 61. That is to say, the series arrangement 63 of diodes 62 is connected in parallel with the static induction thyristor in a reverse polarity. The breakdown voltages of these diodes 62 are set such that a sum of breakdown voltages of respective diodes becomes not less than the breakdown voltage of the static induction thyristor 61.

Figure 1:
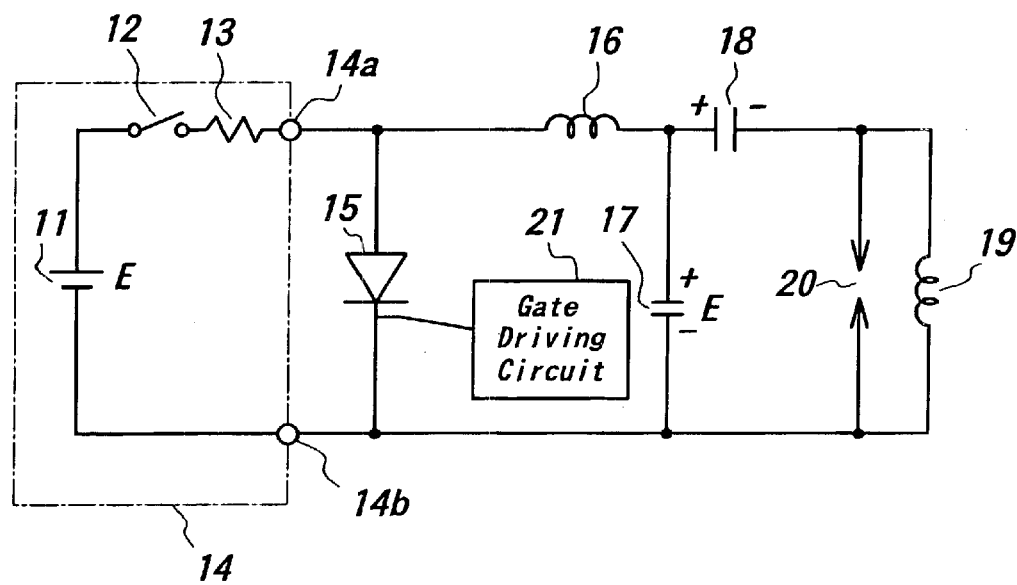
FIG. 1 is a circuit diagram showing an example of a known pulse generating circuit using a static induction thyristor.
Figure 2:
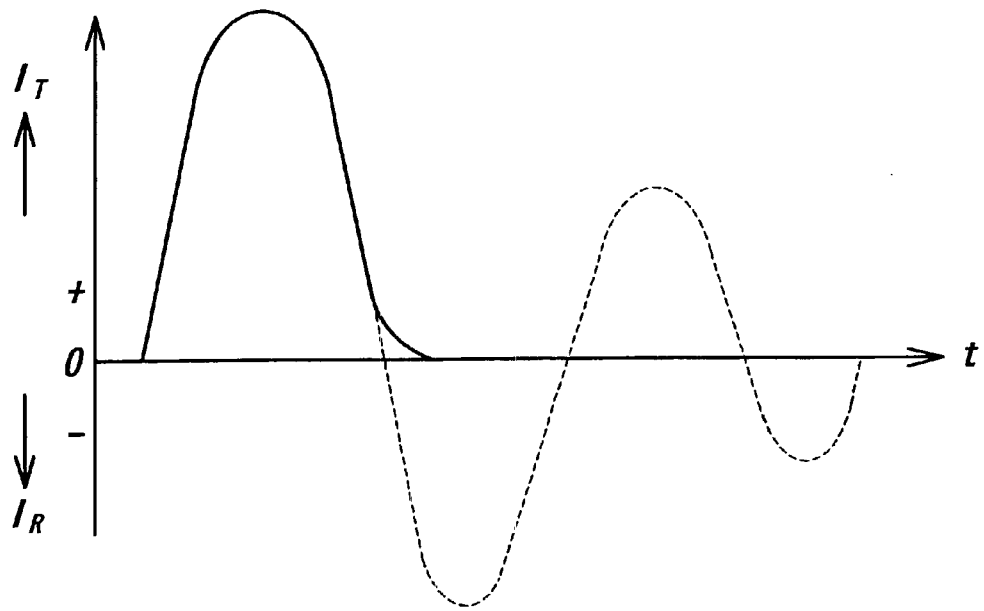
FIGS. 2 and 3 are graphs illustrating the operation of the thyristor shown in FIG. 1.
Figure 3:
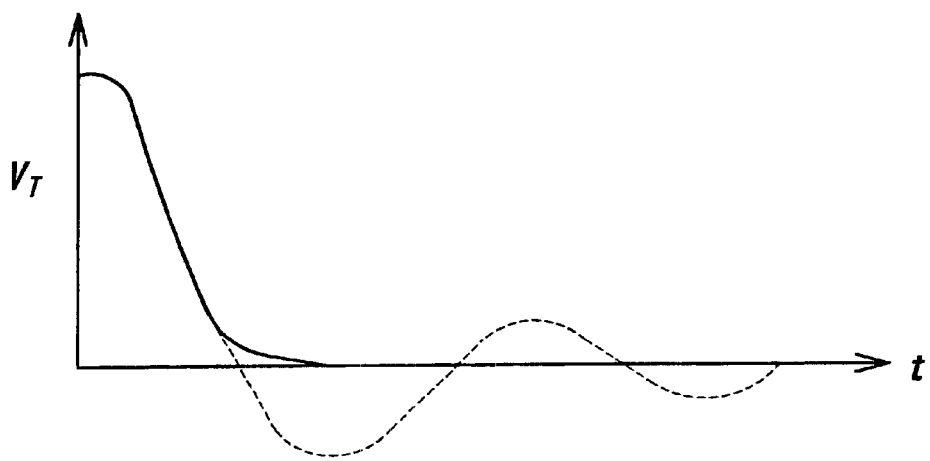
Figure 4:
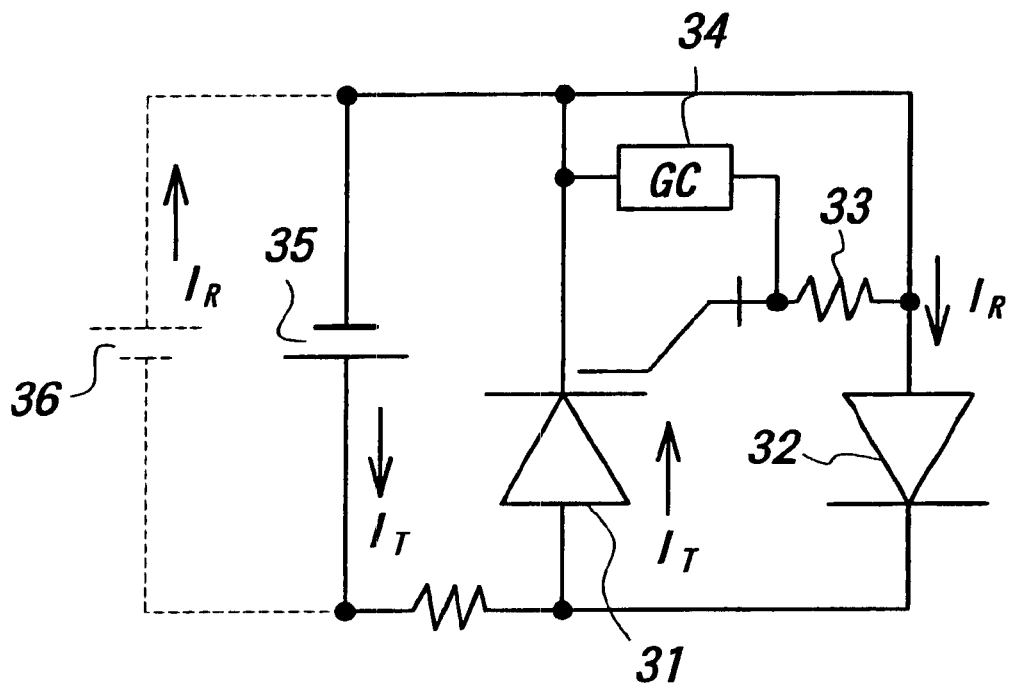
FIG. 4 is a schematic diagram depicting a principal structure of a known reverse conducting static induction thyristor.
Figure 5:
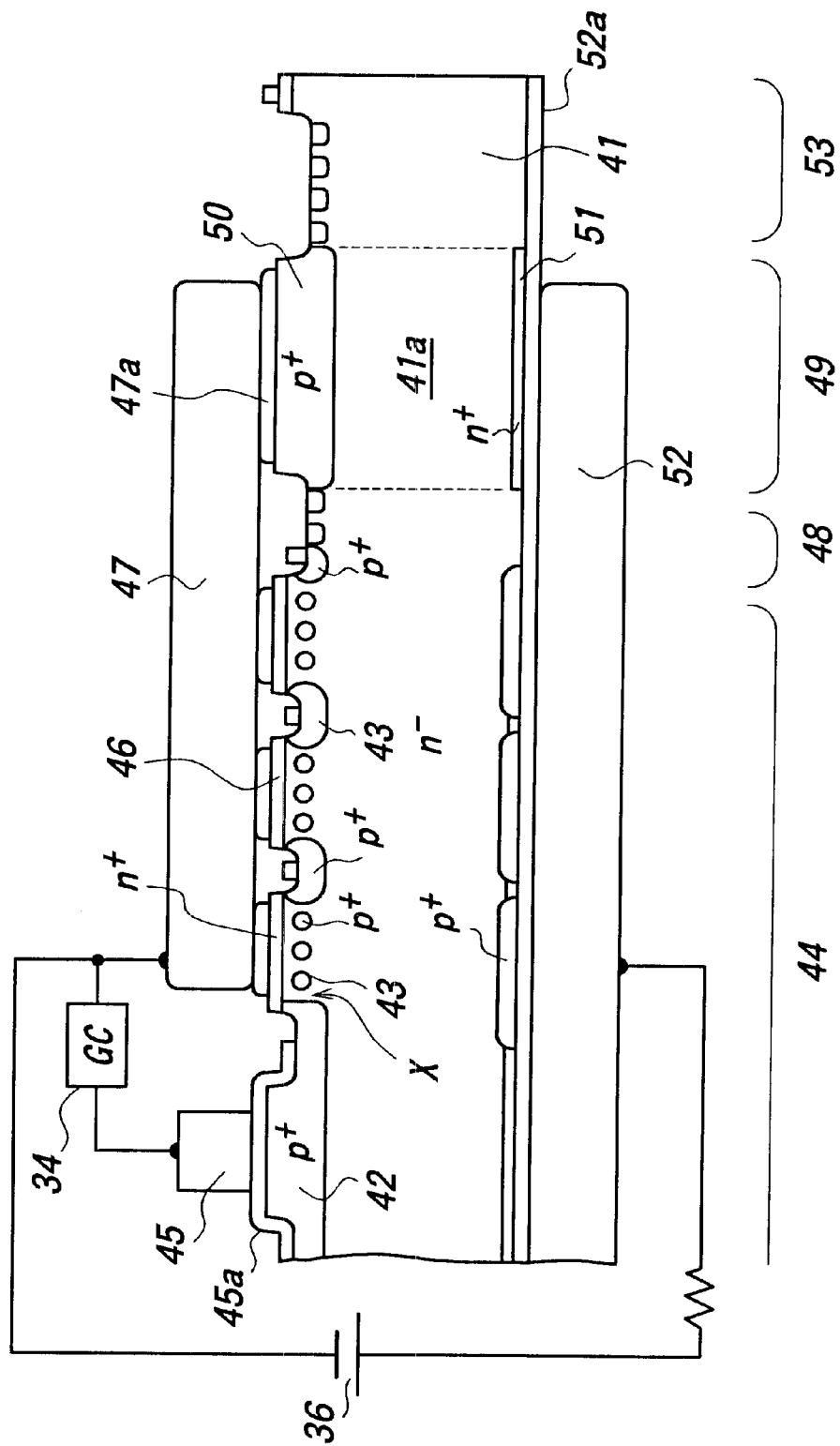
FIG. 5 is a cross sectional view showing a detailed structure of the known reverse conducting thyristor.
Figure 7B:
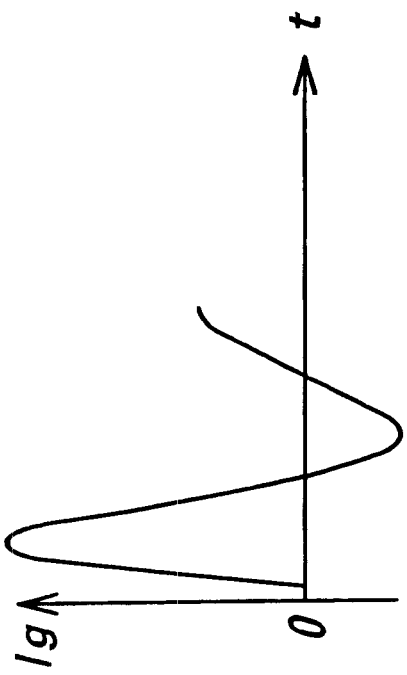
Figure 7A:
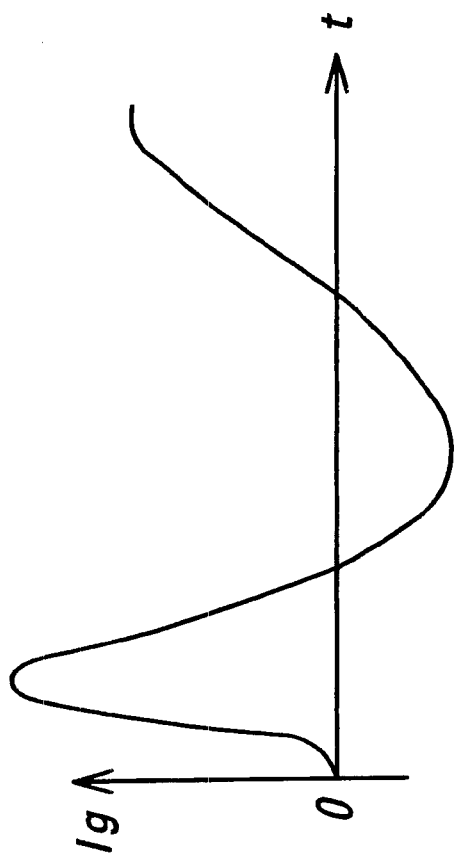
Figure 8B:
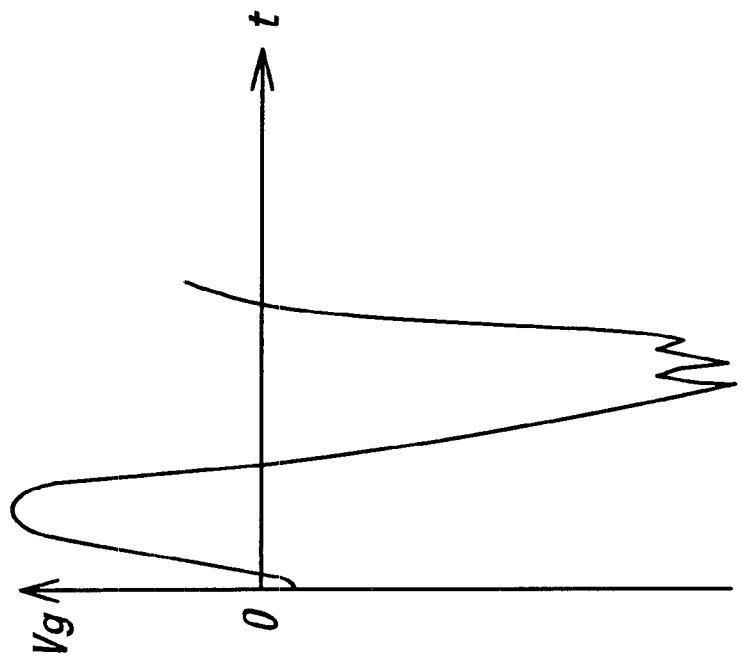
Figure 8A:
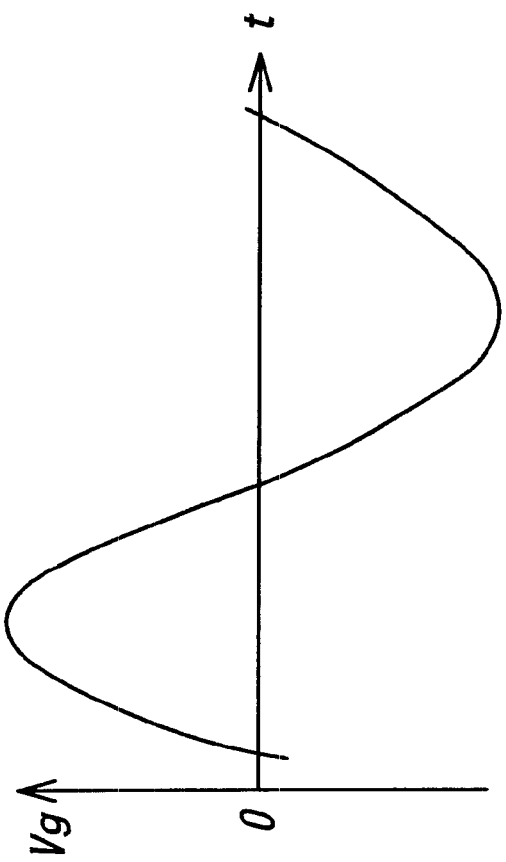
Figure 10A:
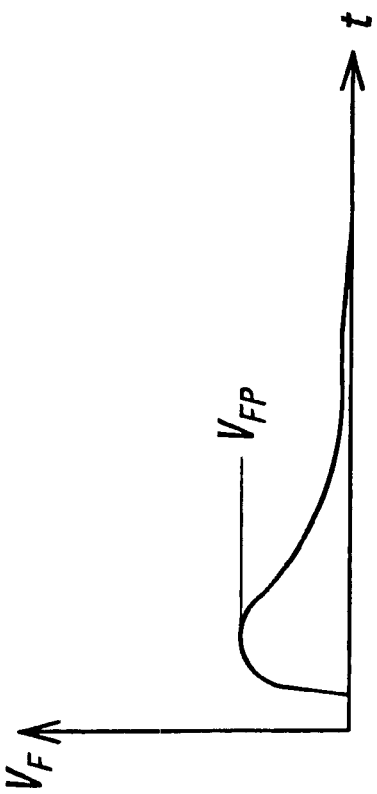
FIGS. 10A and 10B are signal waveforms denoting a transient turn-on voltage of the known reverse conducting static induction thyristor.
Figure 10B:
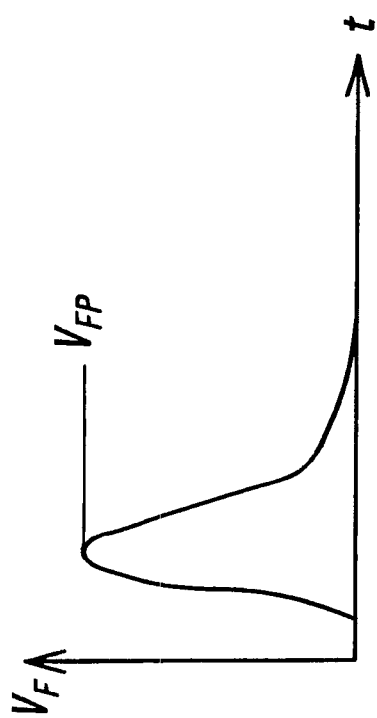
Figure 11:
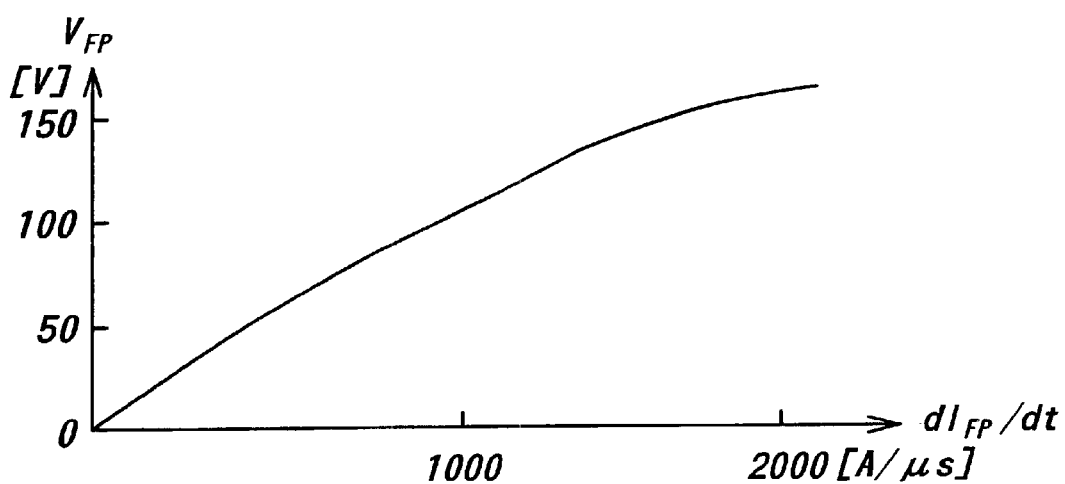
FIG. 11 is a graph expressing a relationship between an inclination of a current and a forward recovery voltage of a diode.
Figure 12:
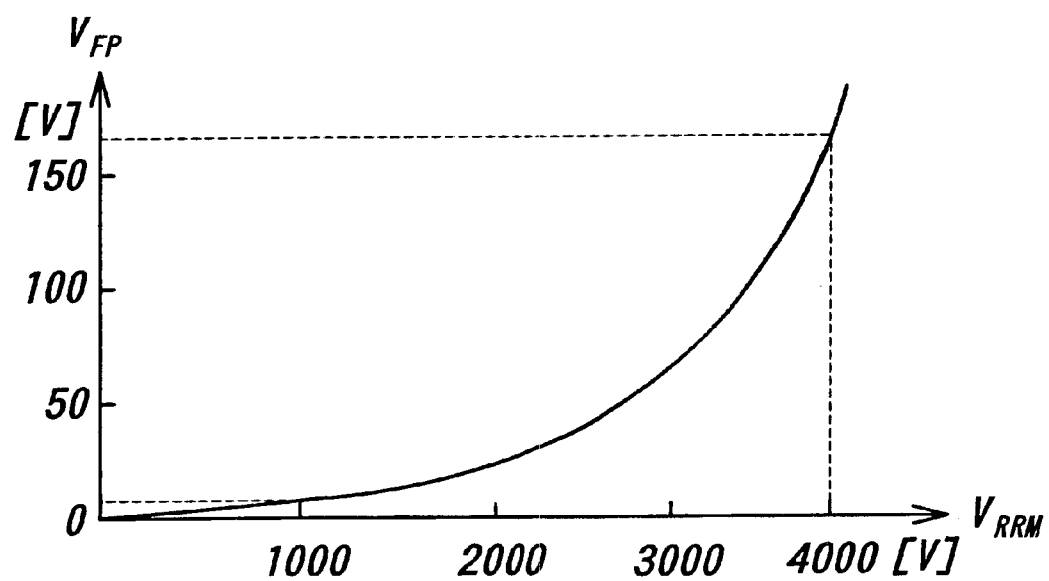
FIG. 12 is a graph showing a relationship between a breakdown voltage and a forward recovery voltage of a diode.

For instance, now it is assumed that all the diodes 62 have the same characteristics and the static induction thyristor 61 has the breakdown voltage of 4000 V, then eight diodes each having a breakdown voltage of 500 V may be connected in series. In this case, as can be understood from FIG. 12, the forward recovery voltage $V_{FP}$ of each diodes becomes about 10 V. Even if eight diodes are connected in series, a total forward recovery voltage of the series arrangement of diodes becomes 80 V(=10×8) which is sufficiently lower than the forward recovery voltage of about 170 V of a single diode having a breakdown voltage of 4000 V. When a reverse current is to be flown abruptly through the anode-cathode path of the static induction thyristor 61, the series arrangement 63 of diodes 62 are conducted. Therefore, the reverse current flowing through the static induction thyristor 61 is reduced and a high reverse voltage is not applied to the static induction thyristor. In this manner, the static induction thyristor 61 can be effectively protected against the breakdown.

Figure 14:
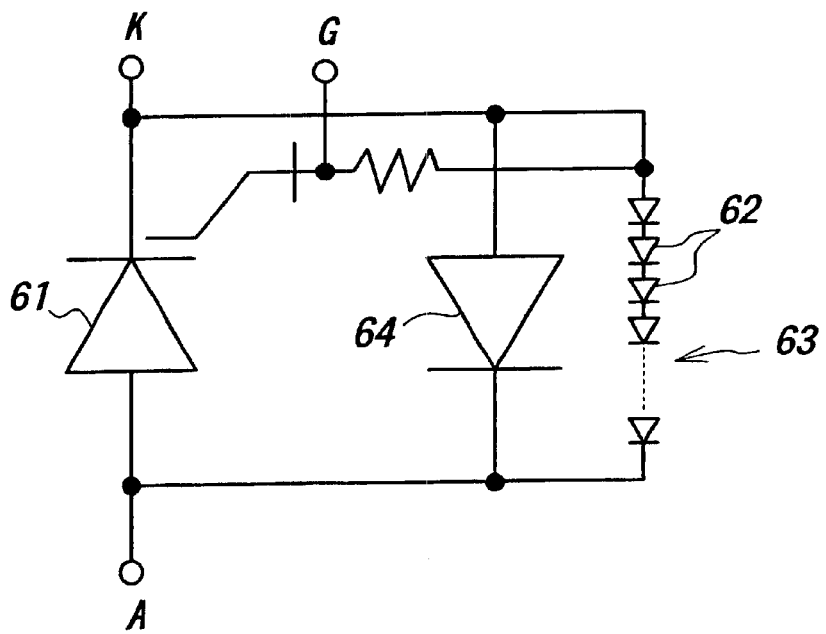
FIG. 14 is a schematic diagram depicting another principal structure of the semiconductor device according to the invention.

FIG. 14 is a schematic diagram illustrating another principal structure of the semiconductor device according to the invention. In this structure, the static induction thyristor is constructed as the reverse conducting static induction thyristor having a static induction thyristor section 61 and a diode section 64 connected in parallel with the static induction thyristor section 61 in a reverse polarity. Furthermore, a series arrangement 62 of a plurality of diodes 62 is connected in parallel with the reverse conducting static induction thyristor.

The semiconductor device according to the invention having the above explained principal structures may be embodied in various ways. For instance, the series arrangement 63 of a plurality of diodes 62 may be formed on a same semiconductor substrate of the static induction thyristor 61 as a single unit. Particularly, when the semiconductor device is used in a high frequency circuit, it is necessary to make a stray inductance of wiring conductors as small as possible, and therefore it is preferable to construct the static induction thyristor 61 and series arrangement 63 of a plurality of diodes 62 in a single common semiconductor substrate. Furthermore, in the semiconductor device according to the invention, the series arrangement 63 of a plurality of diodes 62 may be constructed separately from a semiconductor substrate on which the static induction thyristor 61 is formed. In this case, the series arrangement 63 of diodes is preferably arranged within a package in which the static induction thyristor 61 is arranged, but it may be provided outside the package. This type of structure may be advantageously applied to the known semiconductor devices such as the static induction thyristor 61 shown in FIG. 13 and the reverse conducting static induction thyristor having the static induction thyristor 61 and the single diode 64 illustrated in FIG. 14.

Figure 15:
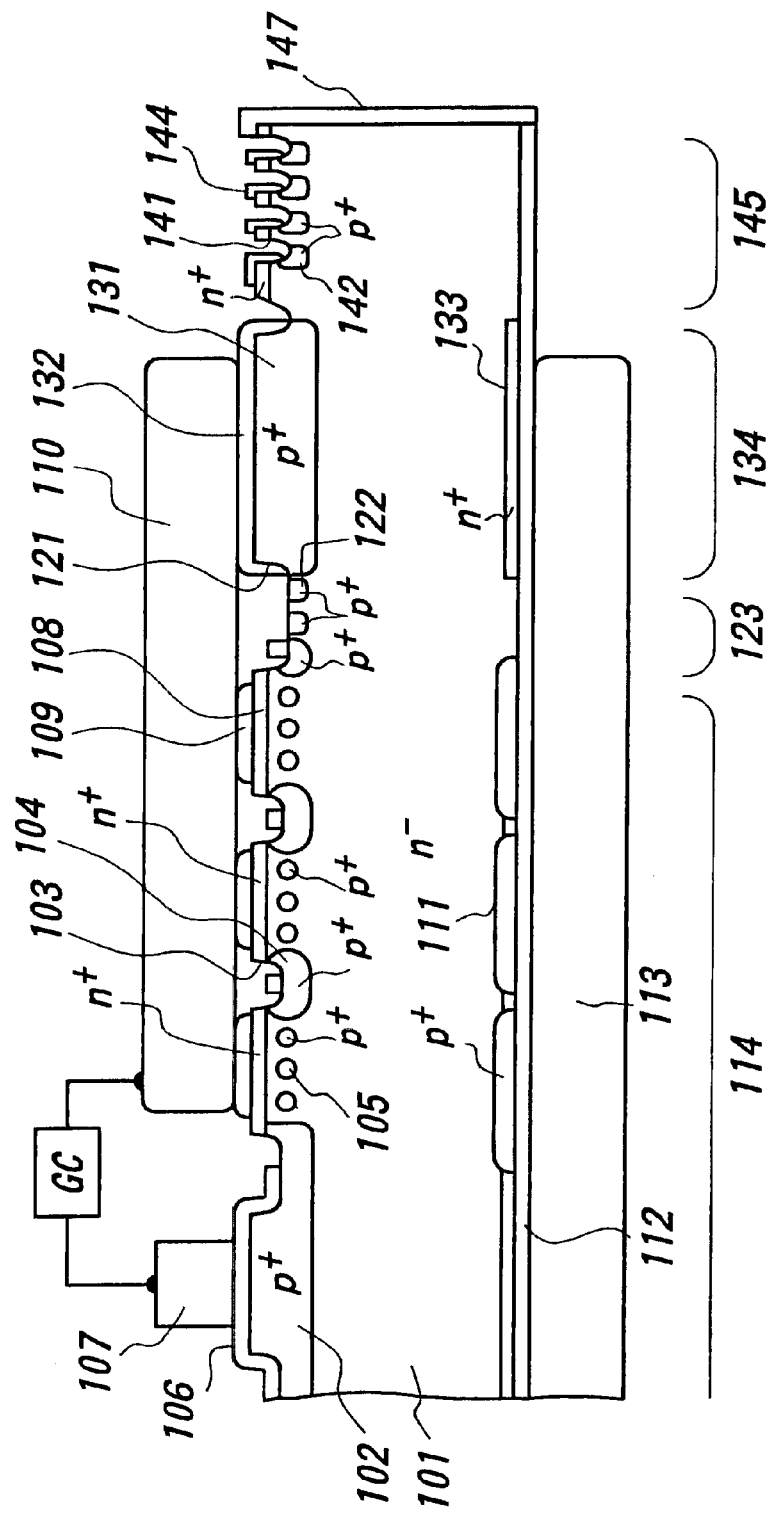
FIG. 15 is a cross sectional view showing a detailed structure of a first embodiment of the semiconductor device according to the invention.
Figure 16:
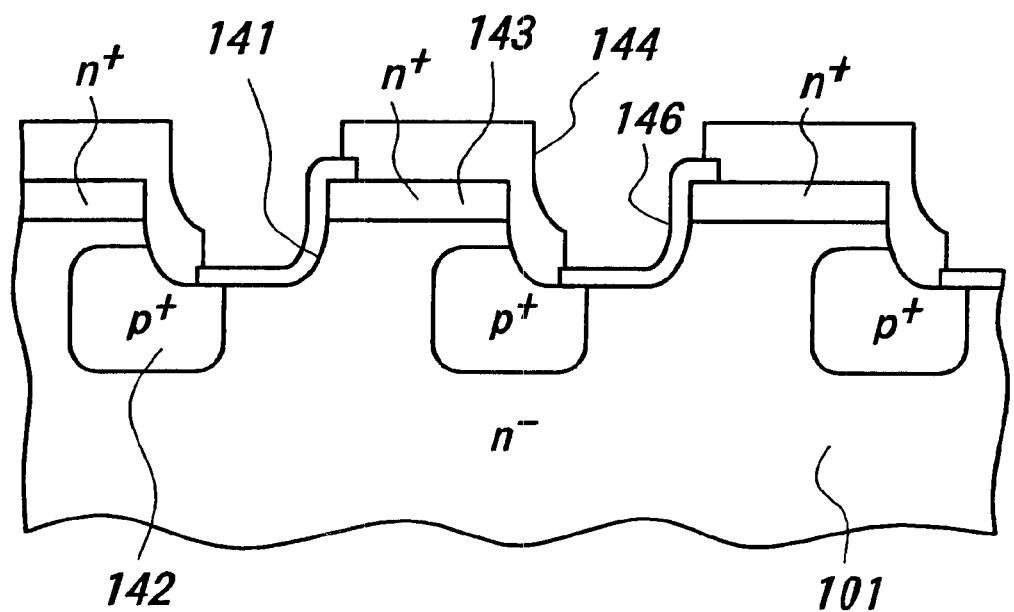
FIG. 16 is an enlarged cross sectional view of a part of the semiconductor device shown in FIG. 15.

FIGS. 15 and 16 are cross sectional views illustrating a first embodiment of the semiconductor device according to the invention having the principal structure shown in FIG. 14, in which the series arrangement 63 of a plurality of diodes 62 is connected in parallel with the switching element, i.e. static induction thyristor 61 as well as the single diode 64. A p$^+$ gate region (control region) 102 is formed substantially at a center area of one major surface of an n$^-$ silicon substrate 101, a plurality of first ring-shaped recesses 103 are formed to surround the gate region 102, and gate regions 104 are formed along the recesses 103. Furthermore, buried gate regions 105 are formed in channel regions formed by parts of the silicon substrate 101 surrounded by successive gate regions 102 and 104. On the gate regions 102 and 104 are formed conductive layers 106 and a gate electrode 107 is provided on the conductive layer at the central gate region 102. In surface portions of the channel regions, there are formed n$^+$ cathode regions (one major electrode region) 108 and the cathode regions are connected to a cathode electrode 110 via conductive layers 109. In the other major surface of the silicon substrate 101, there are formed p$^+$ anode regions (the other major electrode region) 111, which are connected to an anode electrode 113 via a conductive layer 112. In this manner, the thyristor section 114 is constructed.

In the first major surface of the silicon substrate 101, there is formed a single ring-shaped second recess 121 and a plurality of ring-shaped p$^+$ regions 122 are formed on a bottom of the second recess to construct a separation band 123.

Outside the separation band 123, there is formed a p$^+$ anode region 131 of a main diode 134, said anode region having a wider width than the remaining p$^+$ regions 104 in the thyristor section 114. The anode region 131 is connected to the cathode electrode 110 via a conductive layer 132 of the thyristor section 114. A cathode region of the main diode section 134 is formed by a bulk of the n$^-$ silicon substrate 101 situating under the anode region 131. In the second major surface of the silicon substrate 101 at a portion corresponding to the anode region 131, there is formed an n$^+$ emitter region 133, which is connected to the anode electrode 113 of the thyristor section 144. In this manner, the main diode section 134 serving to protect the thyristor section from the breakdown is formed such that the main diode section 134 is connected in parallel with the thyristor section 114 in a reverse polarity.

The structure of the thyristor section 114, separation band 123 and main diode section 134 is identical with that of the known reverse conducting static induction thyristor. According to the present invention, in the first major surface of the silicon substrate 101, there are formed a plurality of ring-shaped third recesses 141 are formed to surround the main diode section 134, and in bottoms of these third recesses there are formed p$^+$ anode regions 142. As clearly illustrated in FIG. 16, each of the anode regions 142 is formed at a position deflected toward one side of the third recess 141. Between successive third recesses 141 there are formed n$^+$ cathode contact regions 143, and the successive cathode regions 143 are connected to adjacent p$^+$ anode regions 142 successively to constitute a series arrangement of a plurality of diodes by means of conductive layers 144. In this manner, a series arrangement section 145 is formed. Although not shown in FIG. 15, exposed portions of the first major surface of the silicon substrate 101 are covered with insulating layers 146 such as silicon oxide layers as shown in FIG. 16.

As illustrated in FIG. 15, an anode region of the innermost diode in the series arrangement section 145 is formed by the anode region 131 of the main diode section 34, and a cathode of the outermost diode is connected to the anode electrode 113 of the static induction thyristor by means of the outermost cathode contact region 143 and conductive layers 147 and 112. In this manner, there is formed the series arrangement section 145, in which the anode of the innermost diode is connected to the cathode electrode 110 of the thyristor and the cathode of the outermost diode is connected to the anode electrode 113. The main diode section 134 is connected in parallel with the series arrangement section 145 of a plurality of diodes.

In the semiconductor device of the present embodiment, each of the plural diodes of the series arrangement section 145 has a breakdown voltage which is sufficiently lower than a breakdown voltage of the main diode section 134, and therefore its forward recovery voltage is sufficiently lower than that of the main diode section and energy loss due to the forward conduction becomes also very small. When a reverse voltage is applied to the thyristor section 114, at first a plurality of diodes in the series arrangement section 145 are made conductive and then the main diode section 134 is made conductive. In this manner, the thyristor section 134 can be effectively prevented from the breakdown.

Figure 17:
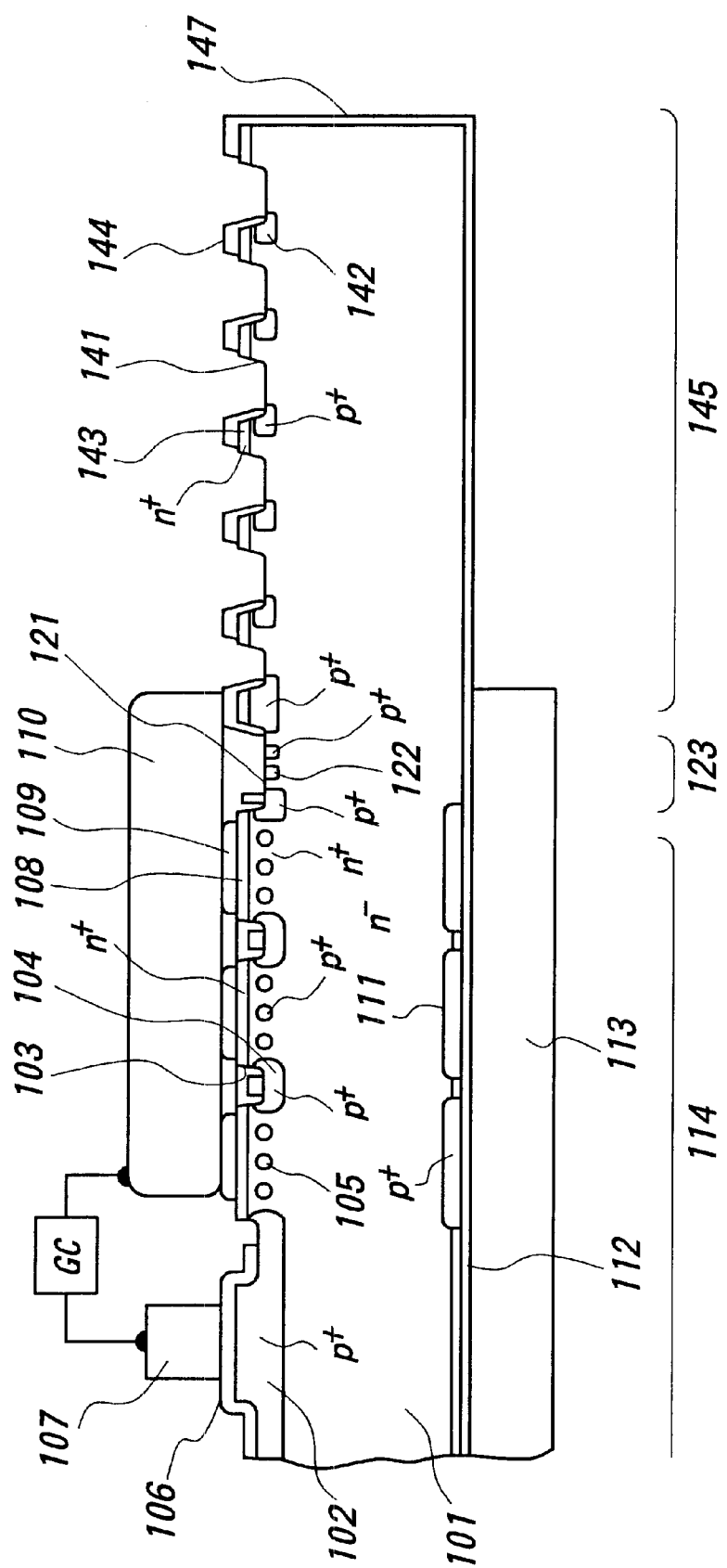
FIG. 17 is a cross sectional view showing a detailed structure of a second embodiment of the semiconductor device according to the invention.
Figure 18:
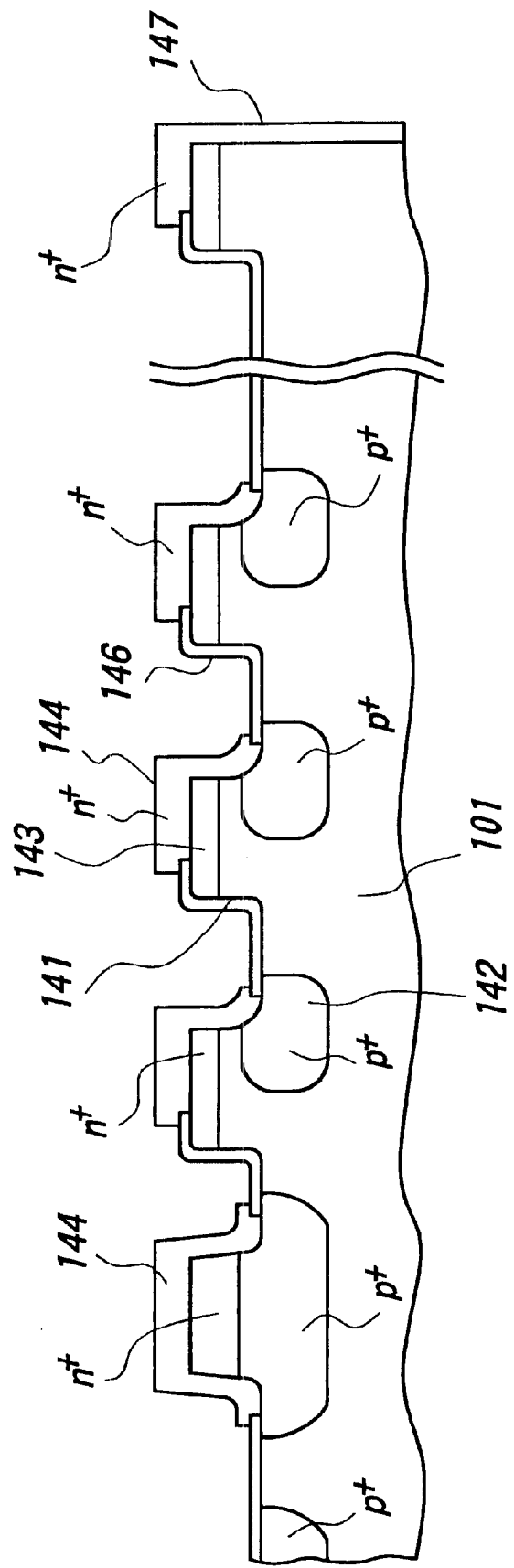
FIG. 18 is an enlarged cross sectional view of a part of the semiconductor device shown in FIG. 17.

FIGS. 17 and 18 are cross sectional views illustrating a second embodiment of the semiconductor device according to the invention. In the present embodiment, the switching element is formed by the static induction thyristor without the main diode, and portions similar to those of the first embodiment are denoted by the same reference numerals used in FIGS. 15 and 16. The ring-shaped recesses 141 formed in the series arrangement section 145 of a plurality of diodes are formed such that successive recesses viewed from the internal one have increasing widths so that the successive diodes have increasing breakdown voltage. Then, the p$^+$ anode regions 142 of these diodes serve optimally as a field limiting ring.

Also in the first embodiment illustrated in FIGS. 15 and 16, the anode regions of a plurality of diodes of the series arrangement section 145 serve as the field limiting ring to some extent, but they do not optimally operate as the field limiting ring, because the third recesses 141 have identical width. In the present embodiment, the third recesses 141 formed in the series arrangement section 145 of a plurality of diodes have widths which are successively increased toward outside such that the p$^+$ anode regions 142 of the diodes work optimally as the field limiting ring. Such a structure may be easily realized by a known field limiting ring designing method.

Figure 19:
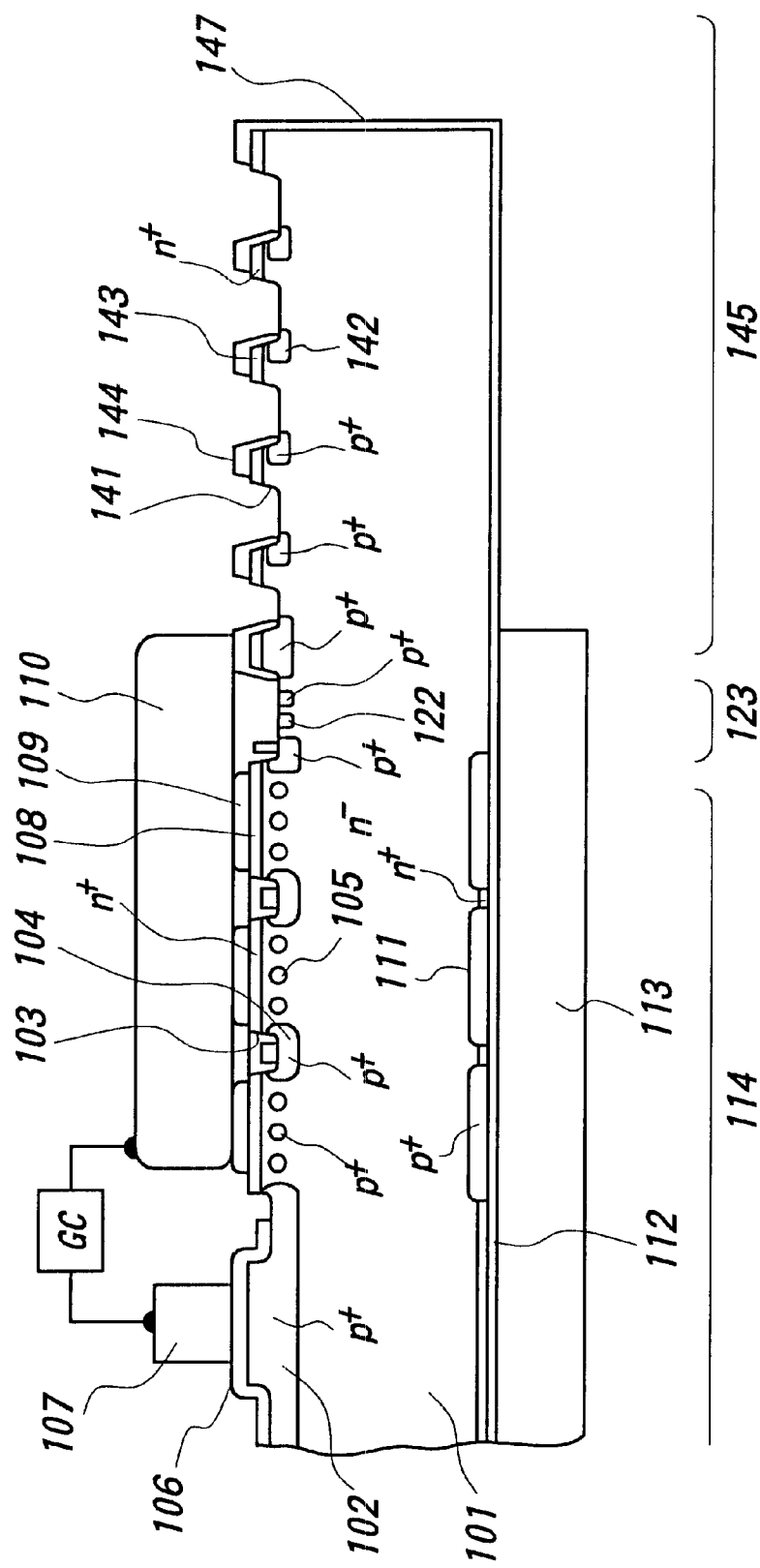
FIG. 19 is a cross sectional view illustrating a detailed structure of a third embodiment of the semiconductor device according to the invention.

FIG. 19 is a cross sectional view showing a third embodiment of the semiconductor device according to the invention. Like as the second embodiment, in the present embodiment, the switching element is formed by the static induction thyristor without a main diode. That is to say, in the first embodiment, the series arrangement section 145 of a plurality of diodes is provided in addition to the main diode section 134, but in the present embodiment the main diode section is not provided. In the present embodiment, a p$^+$ anode region of the innermost diode within the series arrangement 145 of a plurality of diodes is constituted by a p$^+$ region 122 within the separation band 123. The remaining structure of the present embodiment is identical with the above mentioned second embodiment.

Figure 20:
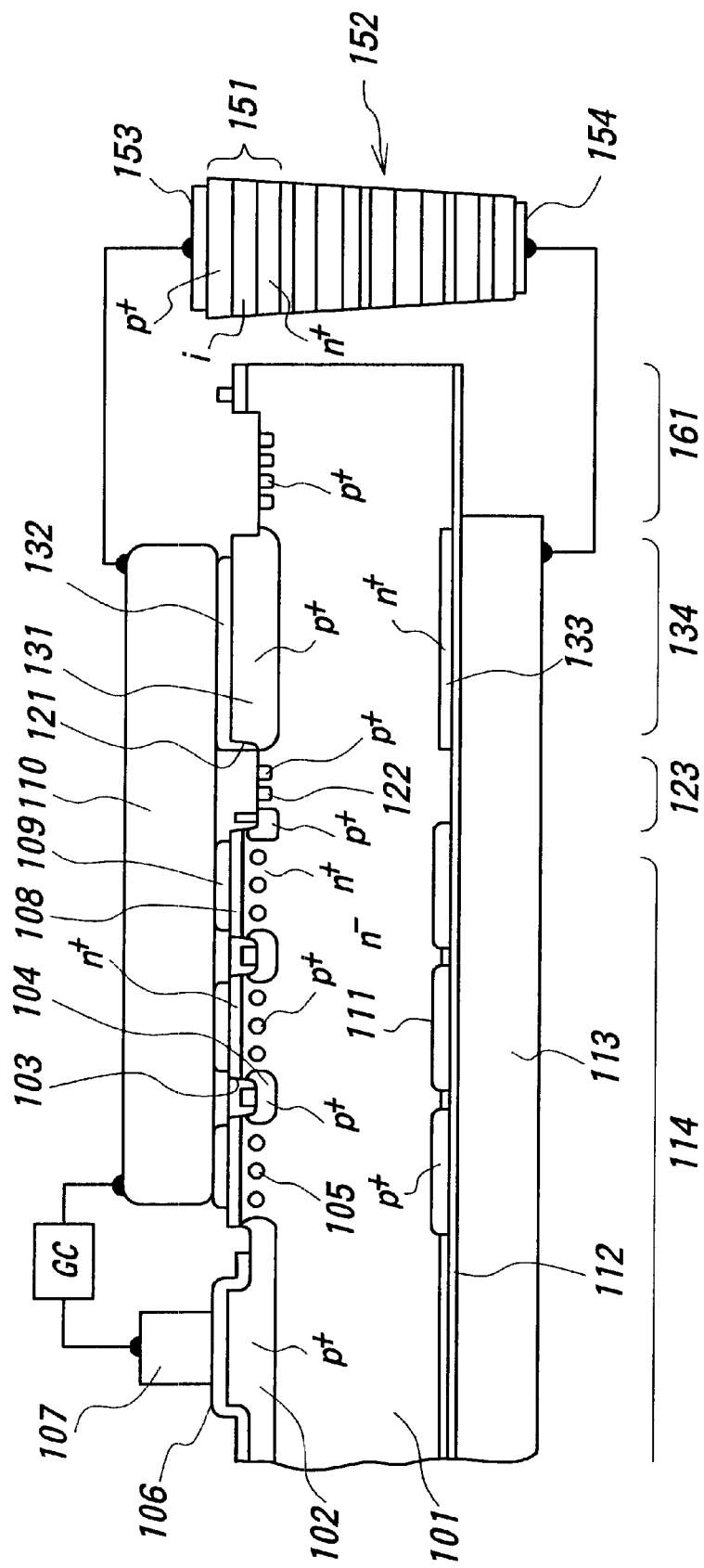
FIG. 20 is a cross sectional view depicting a detailed structure of a fourth embodiment of the semiconductor device according to the invention.

FIG. 20 is a cross sectional view of a fourth embodiment of the semiconductor device according to the invention. In this embodiment, the switching element is formed by the reverse conducting thyristor. In the embodiments so far explained, the series arrangement of diodes is formed on the silicon substrate on which the thyristor is also formed. In the present embodiment, only the thyristor section 114, separation band 123 and main diode section 134 are formed on the silicon substrate 101, and a series arrangement 152 of a plurality of diodes 151 is provided separately from the silicon substrate 101. It should be noted that in FIG. 20, a reference numeral 161 denotes a field limiting ring section.

In this case, the series arrangement of diodes may be formed on a semiconductor wafer like as the previous embodiment, but in the present embodiment, the series arrangement 152 of a plurality of diodes 151 is constructed by a diode stack. Furthermore, in the present embodiment, respective diodes 151 is constructed to have P$^+$-i-n$^+$ structure and the series arrangement 152 is beveled such that a surface area of the diodes 151 is gradually decreased from the anode side to the cathode side. An anode electrode 153 of the series arrangement 152 of a plurality of diodes 151 is connected to the cathode electrode 110 of the thyristor section 114 and a cathode electrode 154 is connected to the anode electrode 13 of the thyristor section 114. The series arrangement 152 of a plurality of diodes 151 is preferably installed within a common package together with the silicon substrate 101 of the reverse conducting thyristor, but it may be installed in a separate package.

Figure 21:
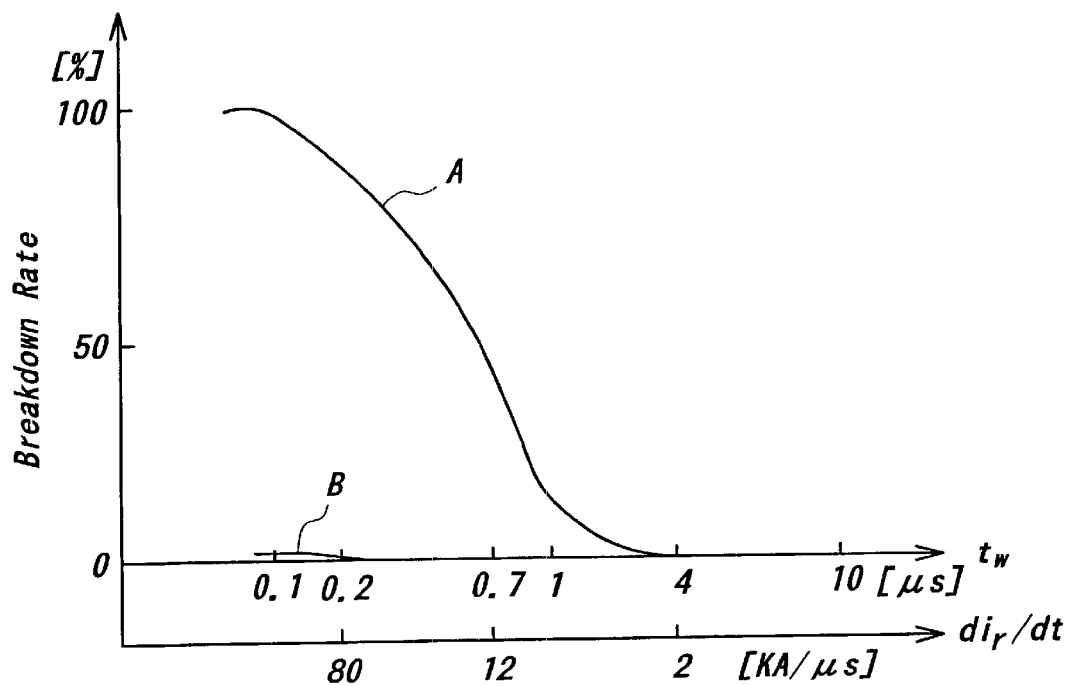
FIG. 21 is a graph representing test results of the semiconductor device according to the invention in comparison with the known reverse conducting thyristor.

FIG. 21 is a graph representing a breakdown rate of the semiconductor device according to the invention in comparison with the known reverse conducting static induction thyristor. In the known reverse conducting static induction thyristor having only the main diode, the breakdown occurs in almost all samples when a width of a pulse voltage applied to the thyristor is not longer than 0.1 µs, i.e. when an inclination of a reverse current is not smaller than about 100 KA/µs as shown by a curve A, and the breakdown occurs in a substantially half number of the samples at about 12 KA/µs. In the semiconductor device according to the invention, no breakdown occurs in all samples even when the reverse current having an abrupt inclination not smaller than 100 KA/µs flows as depicted by a curve B. In this test, a peak value of the forward current is set to 4000 A.

It should be noted that the present invention is not limited to the embodiments explained above, but many alternations and modifications may be conceived by a person skilled in the art within the scope of the invention defined by claims. For instance, in the above embodiments, the switching element formed on the semiconductor substrate is constituted by the static induction thyristor, but according to the invention, the switching element may be formed by any other switching element such as the gale turn-off (GTO) SCR and insulated gate bipolar transistor (IGBT). The number of diodes within the series arrangement for use in the pulse generating circuit may be determined at will taking into account of breakdown voltage of the thyristor as well as breakdown voltages of respective diodes.

As stated above in detail, in the semiconductor device according to the present invention, since the series arrangement of a plurality of diodes is connected in parallel with the switching element in a reverse polarity and each of these diodes has a breakdown voltage lower than a breakdown voltage of the switching element, when a current flowing through the switching clement is abruptly decreased and a large reverse voltage is applied to the switching element, the series arrangement of diodes is positively conducted and the switching element can be effectively prevented from breakdown.

Moreover, in the above embodiment in which the anode regions of a plurality of diodes are constructed to serve as the field limiting rings, the series arrangement of diodes can be formed as a substantially same size as a conventional semiconductor device having the field limiting rings. Therefore, an increase in manufacturing cost can be restricted and an increase in cost of the semiconductor device according to the invention can be limited.

What is claimed is:

1. A semiconductor device having reverse conducting faculty comprising:
   a switching element including a semiconductor substrate of a first conductivity type having first and second major surfaces, a first main electrode region of the first conductivity type formed in the first major surface of the semiconductor substrate, a first main electrode connected to said first main electrode region, a second main electrode region of a second conductivity type formed in the second major surface of the semiconductor substrate, a second main electrode connected to said second main electrode region, a control electrode region of the second conductivity type formed in the first major surface of the semiconductor substrate for controlling a current passing between the first and second main electrode regions, and a control electrode connected to said control region; and a series arrangement of a plurality of diodes connected between said first main electrode and said second main electrode in an opposite polarity to a current flowing between said first main electrode region and said second main electrode region, each of said plurality of diodes having a breakdown voltage lower than a breakdown voltage of said switching element.

2. The semiconductor device according to claim 1, wherein said series arrangement of a plurality of diodes is formed in said first major surface of the semiconductor substrate in which said first main electrode region is also formed.

3. The semiconductor device according to claim 1, wherein said series arrangement of a plurality of diodes is formed on a separate semiconductor substrate from said semiconductor substrate semiconductor substrate which constitutes said switching element.

4. The semiconductor device according to claim 1, wherein said series arrangement of a plurality of diodes is formed as a diode stack including first and second electrodes connected to said first and second main electrodes of the switching clement, respectively.

5. The semiconductor device according to claim 4, wherein said diode stack is beveled such that surface areas of successive diodes in the diode stack are gradually decreased viewed in a direction in which a current flows through the diode stack.

6. The semiconductor device according to claim 4, wherein each of a plurality of diodes in the diode stack has $p^+$-i-$n^+$ structure.

7. The semiconductor device according to claim 3, wherein said switching device and series arrangement of a plurality of diodes are installed in a common package.

8. The semiconductor device according to claim 3, wherein said switching element and said series arrangement of a plurality of diodes are installed in separate packages.

9. The semiconductor device according to claim 1, wherein said switching element is formed as a static induction thyristor whose cathode region and cathode electrode are formed by said first main electrode region and first main electrode, respectively, whose anode region and anode electrode are formed by said second main electrode region and second main electrode, respectively, and whose gate region and gate electrode are formed by said control region and control electrode, respectively.

10. The semiconductor device according to claim 9, wherein said semiconductor substrate is formed by an $n^-$ semiconductor substrate, and said series arrangement of a plurality of diodes comprises a plurality of recesses formed in the first major surface of the $n^-$ semiconductor substrate, a plurality of $p^+$ anode regions formed at bottom surfaces of said plurality of recesses, a plurality of $n^-$ cathode regions formed by portions of said first major surface of said $n^+$ semiconductor substrate situating between successive recesses, a plurality of conductive layers formed on the first major surface of the $n^-$ semiconductor substrate via insulating layers such that said $p^+$ anode regions and $n^+$ cathode regions are successively connected by said conductive layers, and a cathode conductive layer for connecting an $n^+$ cathode region of the outermost diode to said anode electrode of the static induction thyristor.

11. The semiconductor device according to claim 10, wherein said series arrangement of a plurality of diodes further comprises a plurality of $n^+$ cathode contact regions formed between said $n^-$ cathode regions and said conductive layers.

12. The semiconductor device according to claim 10, wherein said recesses, anode regions and cathode regions of the series arrangement of a plurality of diodes are formed as ring-shape surrounding said static induction thyristor.

13. The semiconductor device according to claim 12, wherein said recesses and anode regions of the series arrangement of a plurality of diodes are formed to serve as field limiting rings.

14. The semiconductor device according to claim 12, wherein said recesses of the series arrangement of a plurality of diodes are formed such that widths of successive recesses are increased toward outside.

15. The semiconductor device according to claim 1, wherein said switching element is formed as a reverse conducting static induction thyristor including a thyristor section whose cathode region and cathode electrode are formed by said first main electrode region and first main electrode, respectively, whose anode region and anode electrode are formed by said second main electrode region and second main electrode, respectively, and whose gate region and gate electrode are formed by said control region and control electrode, respectively; and a main diode section having an anode region connected to said cathode electrode of the thyristor section and a cathode region connected to said anode electrode of the thyristor section.

16. The semiconductor device according to claim 15, wherein said semiconductor substrate is formed by an $n^-$ semiconductor substrate;

said main diode comprises a $p^+$ anode region formed in said first major surface of the $n^-$ semiconductor substrate, said $p^+$ anode region having a width longer than that of the gate regions of the thyristor section; and said series arrangement of a plurality of diodes comprises a plurality of recesses formed in the first major surface of the $n^-$ semiconductor substrate, a plurality of $p^+$ anode regions formed at bottom surfaces of said plurality of recesses, a plurality of $n^-$ cathode regions formed by portions of said first major surface of said $n^-$ semiconductor substrate situating between successive recesses, a plurality of conductive layers formed on the first major surface of the $n^-$ semiconductor substrate via insulating layers such that said $p^+$ anode regions and $n^+$ cathode regions are successively connected by said conductive layers, and a cathode conductive layer for connecting an $n^+$ cathode region of the outermost diode to said anode electrode of the static induction thyristor.

17. The semiconductor device according to claim 16, wherein an anode region of the innermost diode of said series arrangement is formed by said $p^+$ anode region of said main diode.

18. The semiconductor device according to claim 16, wherein said series arrangement of a plurality of diodes further comprises a plurality of $n^+$ cathode contact regions formed between said $n^-$ cathode regions and said conductive layers.

19. The semiconductor device according to claim 16, wherein said recesses, anode regions and cathode regions of the series arrangement of a plurality of diodes are formed as ring-shape surrounding said thyristor section and main diode.

20. The semiconductor device according to claim 19, wherein said recesses and anode regions of the series arrangement of a plurality of diodes are formed to serve as field limiting rings.

21. The semiconductor device according to claim 20, wherein said recesses of the series arrangement of a plurality of diodes are formed such that widths of successive recesses are increased toward outside.

* * * * *